(12) United States Patent
Hong

(10) Patent No.: US 8,106,519 B2
(45) Date of Patent: Jan. 31, 2012

(54) METHODS FOR PITCH REDUCTION

(75) Inventor: Shih Ping Hong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 953 days.

(21) Appl. No.: 12/107,270

(22) Filed: Apr. 22, 2008

(65) Prior Publication Data

US 2009/0261479 A1 Oct. 22, 2009

(51) Int. Cl.
*H01L 23/48* (2006.01)
(52) U.S. Cl. .......................... 257/775; 438/689
(58) Field of Classification Search .......... 257/775; 438/689
See application file for complete search history.

(56) References Cited

U.S. PATENT DOCUMENTS

| | | | |
|---|---|---|---|
| 5,328,810 A | 7/1994 | Lowrey et al. | |
| 6,110,837 A | 8/2000 | Linliu et al. | |
| 6,376,294 B1 | 4/2002 | Tzeng et al. | |
| 6,395,596 B1 | 5/2002 | Chien et al. | |
| 6,403,417 B1 | 6/2002 | Chien et al. | |
| 6,416,933 B1 | 7/2002 | Singh et al. | |
| 6,518,125 B1 | 2/2003 | Chang et al. | |
| 6,734,107 B2 | 5/2004 | Lai et al. | |
| 6,750,150 B2 | 6/2004 | Chung et al. | |
| 6,774,051 B2 | 8/2004 | Chung et al. | |
| 6,867,116 B1 | 3/2005 | Chung et al. | |
| 6,887,627 B2 | 5/2005 | Chung et al. | |
| 6,893,972 B2 | 5/2005 | Rottstegge et al. | |
| 6,946,400 B2 | 9/2005 | Chung et al. | |
| 6,955,961 B1 | 10/2005 | Chung et al. | |
| 7,183,205 B2 | 2/2007 | Hong et al. | |
| 7,256,126 B1 | 8/2007 | Chen et al. | |
| 7,465,525 B2 * | 12/2008 | Sadjadi et al. | 430/5 |
| 7,534,723 B2 * | 5/2009 | Park et al. | 438/669 |
| 2003/0027420 A1 | 2/2003 | Lai et al. | |
| 2003/0134478 A1 | 7/2003 | Lai et al. | |
| 2005/0079722 A1 | 4/2005 | Yu | |
| 2005/0272259 A1 | 12/2005 | Hong | |

FOREIGN PATENT DOCUMENTS

| | | |
|---|---|---|
| JP | 05190811 | 7/1993 |
| JP | 06151876 | 5/1994 |

* cited by examiner

*Primary Examiner* — Douglas Menz
(74) *Attorney, Agent, or Firm* — Haynes Beffel & Wolfeld LLP

(57) ABSTRACT

An integrated circuit described herein includes a substrate and a plurality of lines overlying the substrate. The lines define a plurality of first trenches and a plurality of second trenches. The plurality of first trenches extend into the substrate a distance different than that of the plurality of second trenches. Adjacent pairs of lines are separated by a first trench in the plurality of first trenches, and each pair of lines comprises a first line and a second line defining a corresponding second trench in the plurality of second trenches.

20 Claims, 20 Drawing Sheets

METHODS FOR PITCH REDUCTION

BACKGROUND OF THE INVENTION

1. Field of the Invention

The present invention relates to integration circuit fabrication, and more particularly to methods of fabricating integrated circuits with reduced pitch.

2. Description of Related Art

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density.

Increases in circuit density often are limited by the resolution of the available photolithographic equipment. The minimum size of features and spaces that a given piece of photolithographic equipment can produce is related to its resolution capacity.

The sum of the minimum feature width and minimum space width producible with a given piece of photolithographic equipment is the minimum pitch that the piece of equipment can produce. The minimum feature width can often times be approximately equal to the minimum space width, so the minimum pitch that can be produced with a given piece of photolithographic equipment is approximately equal to double the minimum feature width that it can produce.

Some attempts have been made to try and reduce the pitch of an integrated circuit device below that of the minimum pitch produced lithographically, but these methods are difficult to control and show varying results.

In view of the drawbacks of the prior methods, it is necessary to provide a method that can reduce the pitch in a device below that producible by the lithographic process.

SUMMARY OF THE INVENTION

The present invention provides integrated circuits having a reduced pitch, along with methods for pitch reduction.

An integrated circuit described herein includes a substrate and a plurality of lines overlying the substrate. The lines define a plurality of first trenches and a plurality of second trenches. The plurality of first trenches extend into the substrate a distance different than that of the plurality of second trenches. Adjacent pairs of lines are separated by a first trench in the plurality of first trenches, and each pair of lines comprises a first line and a second line defining a corresponding second trench in the plurality of second trenches.

An integrated circuit described herein includes a substrate and a plurality of enclosed lines overlying the substrate to define a plurality of trenches, wherein adjacent enclosed lines are separated by a first trench in the plurality of trenches, and each enclosed line in the plurality of lines surrounds a second trench in the plurality of trenches.

An integrated circuit described herein comprises a substrate and a plurality of pairs of lines having a pitch less than 260 nm and overlying the substrate to define a plurality of first trenches and a plurality of second trenches, wherein adjacent pairs of lines are separated by a first trench in the plurality of trenches. Each pair of lines comprises a first line and a second line defining a corresponding second trench in the plurality of second trenches, the first and second lines of each pair of lines having a sublithographic width.

Issues have arisen in traditional semiconductor lithography processes which make it difficult to manufacture lines having a lithographic pitch less than 130 nm. The present invention addresses these issues by manufacturing devices having pairs of lines having a small pitch and sublithographic widths, resulting in the formation of high density devices. Furthermore, in embodiments the depths and widths of first and second trenches can be different while the lines can have substantially the same width.

Other aspects and advantages of the present invention can be seen on review of the drawings, the detailed description and the claims, which follow.

DETAILED DESCRIPTION

A detailed description of embodiments of the present invention is provided with reference to the FIGS. 1-20. It is to be understood and appreciated that the process steps and structures described herein do not describe a complete process flow for the manufacturing of an integrated circuit. The invention may be practiced in conjunction with various integrated circuit fabrication techniques that are conventionally used in the art, or that are hereafter developed.

FIGS. 1-8 illustrate a manufacturing process for a pitch reduction method.

Figure 1A:
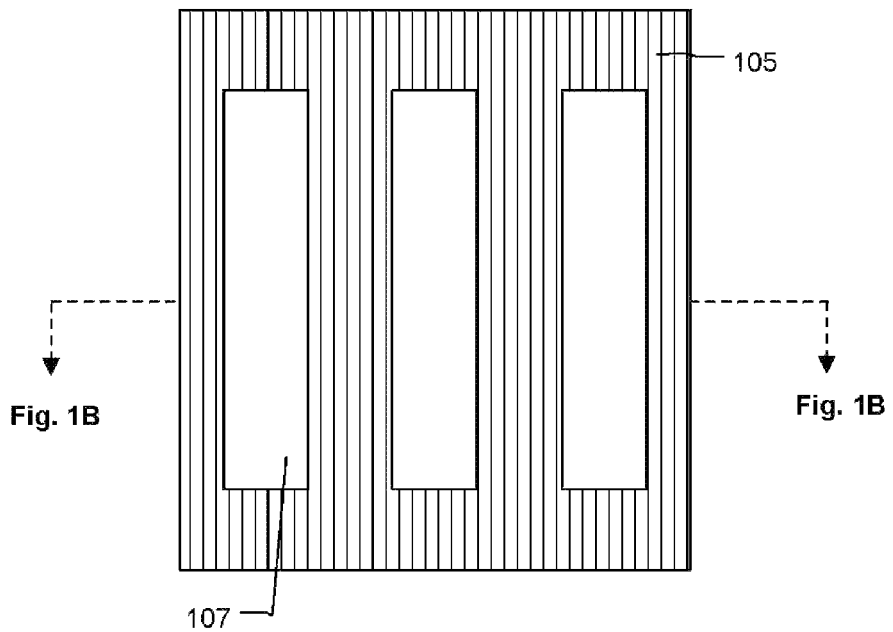
FIGS. 1-8 illustrate a manufacturing process for a pitch reduction method.
Figure 1B:
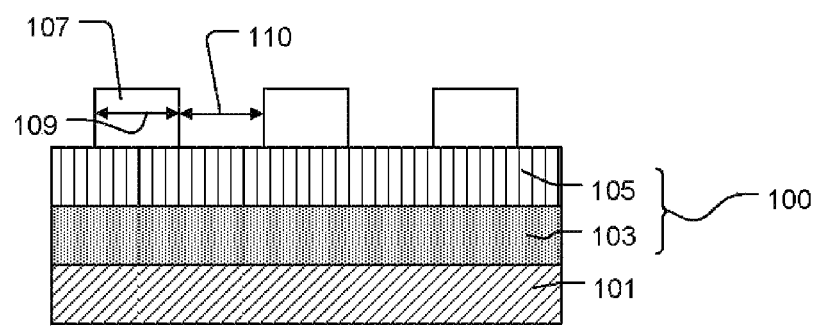

FIGS. 1A and 1B illustrate top and cross-sectional views respectively of photoresist strips 107 patterned on a multi-layer structure 100 overlying a substrate 101. In the illustrated embodiment the multi-layer structure 100 comprises a first layer 103 over the substrate 101 and a second layer 105 over the first layer 103. As used herein, one layer is "over" or "overlying" another layer if it is physically above the other layer. The term does not necessarily preclude one or more intervening layers, although process flow may have to be adjusted in ways that will be apparent to the reader. The layers of the multi-layer structure 100 may each include one or more layers depending upon the ultimately desired circuitry. Also, the substrate layer 101 may also include one more layers. For example, the substrate layer 101 may comprise a first conductive layer on a first dielectric layer, the first dielectric layer on a second conductive layer, the second conductive layer on a second dielectric layer, which in turn is on a semiconductor substrate having source and drains regions implanted therein. In this example the ultimately formed structure might function as a floating gate memory array.

The photoresist strips 107 have a width 109 and a separation distance 110, both the width 109 and distance 110 preferably equal to a minimum feature size for a lithographic process used to form the photoresist strips 107. The width 109 and the separation distance 110 can each be less than 120 nm, for example being between 30 nm and 120 nm.

The first and second layers 103, 105 preferably comprise materials that can be selectively processed (e.g. selectively etched) relative to one another. The first layer 103 may be a dielectric, and in the illustrated embodiment comprises silicon nitride. Silicon nitride may be formed using Chemical Vapor Deposition CVD from a dichlorosilane ($SiCl_2H_2$) and ammonia ($NH_3$).

The second layer 105 may comprise a silicon material, and in the illustrated example comprises polysilicon. Polysilicon can be formed, for example, using Chemical Vapor Deposition CVD from silane ($SiH_4$) source.

Next, the second layer 105 is etched using the photoresist strips 107 as a mask, thereby forming strips 215 comprising material of the second layer 105, the strips 215 having a width 209 and separation distance or width 210. The photoresist 107 is then removed, resulting in the structure illustrated in top and cross-sectional views of FIGS. 2A and 2B respectively. The etch may be performed, for example, using a plasma etch process.

Figure 2A:
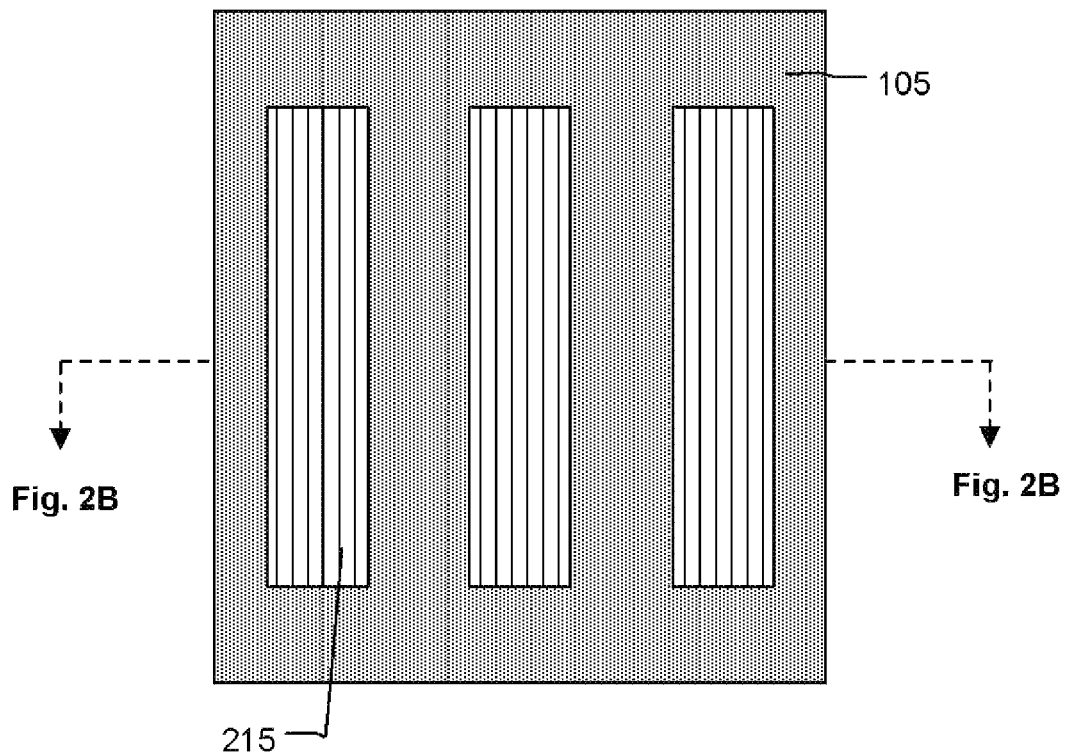
Figure 2B:
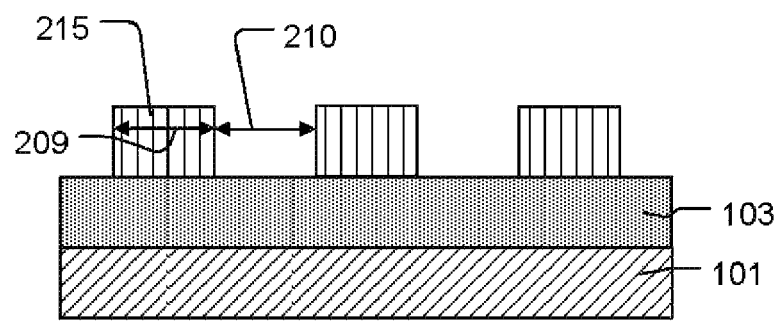
Figure 3A:
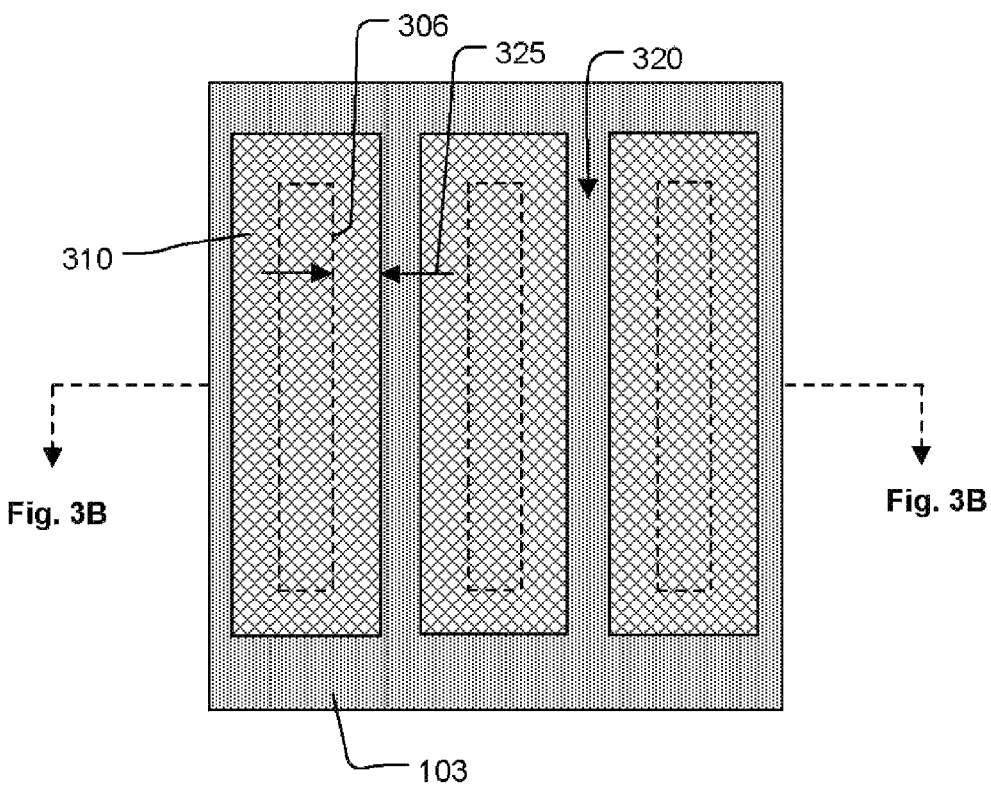
Figure 3B:
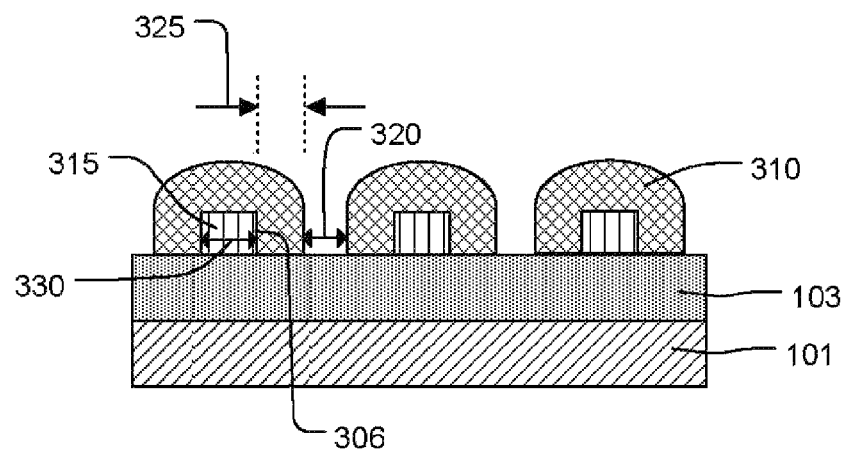

Next, an oxidation process is performed of the structure illustrated in FIGS. 2A and 2B to consume a portion of the strips 215 to form third layer strips 310 on the remaining portion of the strips 315, resulting in the structure illustrated in top and cross-sectional views of FIGS. 3A and 3B. Preferably the first layer 103 comprises material that does not react to the oxidation process.

The oxidation process has the effect of shrinking the originally patterned strips 215 in the vertical and horizontal dimensions, thus the width 330 of the remaining portions of the strips 315 are smaller than the width 209 of the originally patterned strips 215.

Due to the oxidation reaction and the differences in densities of the second layer material and the third layer material, the third layer strips 310 will have widths greater than that of the originally patterned second layer strips 215. Accordingly, the spaces 320 between the third layer strips 310 will be less than the separation distance 210 between the originally patterned second layer strips 215.

As will be shown in subsequent steps, the spaces 320 and the remaining portions of the second layer strips 315 will be used to define the locations of first and second trenches in the first layer 103 respectively. Thus, it will be appreciated that the subsequently formed first and second trenches can be sublithographic in size.

Furthermore, since the widths 330 and the spaces 320 are formed due to the oxidation process and can thus be different, it shall be understood that the subsequently formed first trenches can have a different width that that of the subsequently formed second trenches.

The thickness 325 of third layer material of the third layer strips 310 on the sidewalls 306 of the second layer strips 315 will be used as a mask in subsequent steps to pattern lines in the first layer 103. The thickness 325 depends on many factors including oxidation time, oxidation temperature, and oxidation pressure, and as can be appreciated the thickness 325 can be less than the minimum feature size of the originally patterned second layer strips 215. Therefore, the subsequently formed lines can have sublithographic widths.

Also, since the thickness 325 of the third layer strips 310 on each of the sidewalls 306 of the second layer strips 315 can be substantially similar due to the oxidation process, the subsequently formed lines of layer 103 can each have substantially the same widths. As used herein, the term "substantially" is intended to accommodate manufacturing tolerances.

In the illustrated embodiment a thermal oxidation process is performed to consume a portion of the originally patterned second layer strips 215 comprising polysilicon, thereby forming the third layer strips 310 comprising silicon dioxide. An example thermal oxidation process is to expose the structure in an oxygen-bearing environment at high temperature, e.g. 800° C. The growth of the silicon dioxide strips 310 is the reaction of the of the top and sidewall surfaces of the second layer strips 215. After silicon dioxide begins to build up, the arriving oxygen molecules diffuse through the growing silicon dioxide strips 310 to get to the surface of the second layer strips to react, thereby consuming material of the second layer to generate new silicon dioxide.

Figure 4A:
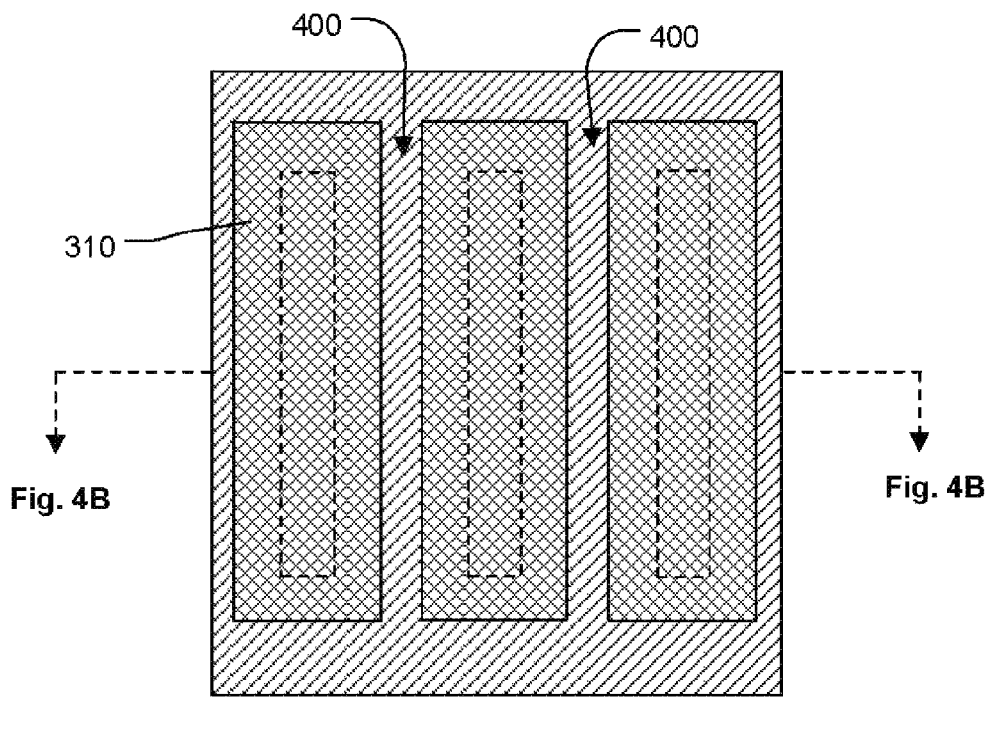
Figure 4B:
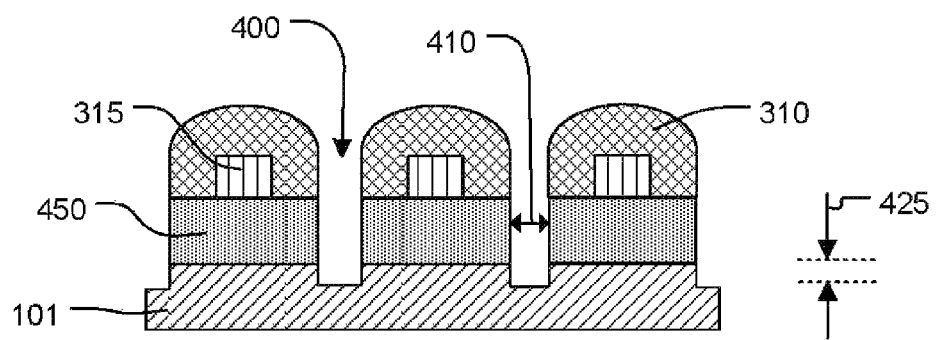

Next, the first layer 103 is etched using the third layer strips 310 as a mask to form first trenches 400 extending into the substrate 101 a distance 425 to define first layer strips 450 of first layer material, resulting in the structure illustrated in FIGS. 4A and 4B respectively. In the illustrated embodiment an anisotropic etch is used that has a high etch rate to silicon nitride of layer 103 and a relatively low etch rate to silicon dioxide of layer 310. An example of an appropriate etch chemistry is $CH_3F/O_2$ or $CH_2F_2$.

In an alternative embodiment the trenches 400 extend to the top surface of the substrate 101. As can be understood, the trench widths 410 between adjacent strips 450 will be less than the separation width 210 of the originally patterned second layer strips 215, and thus the widths 410 of the trenches 400 can be sublithographic. The widths 410 of the first trenches 400 can be less than 60 nm, for example being between 15 nm and 60 nm.

Figure 5A:
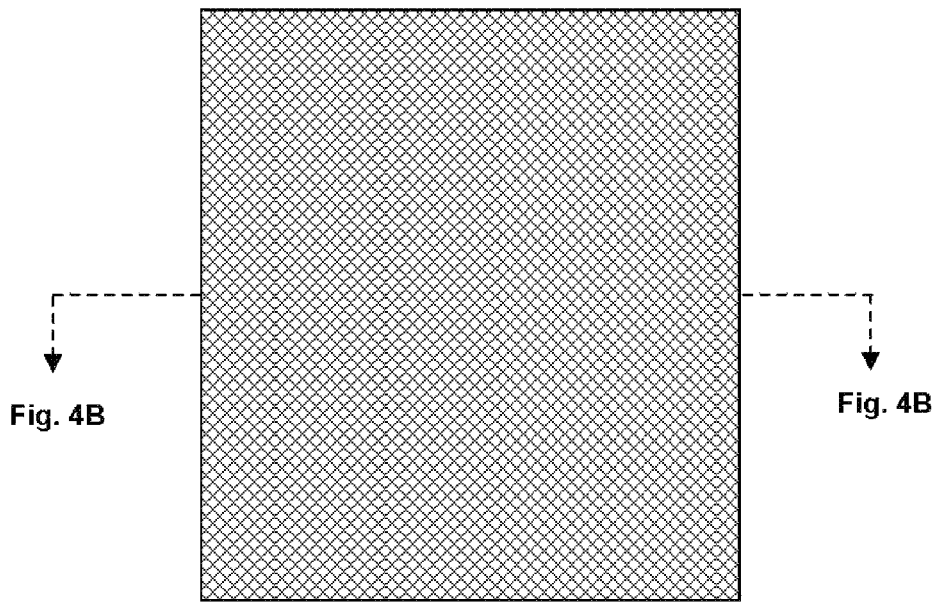
Figure 5B:
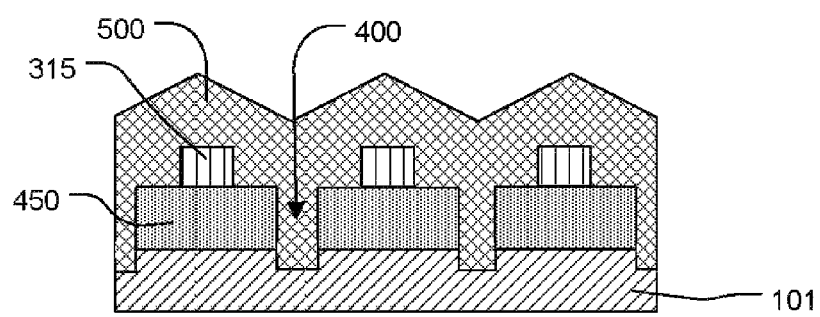

Next, a fourth layer 500 is formed on the structure illustrated in FIGS. 4A and 4B, resulting in the structure illustrated in the top and cross-sectional views of FIGS. 5A and 5B respectively. In the illustrated embodiment, the fourth layer 500 comprises the same material as that of the third layer 310 (not shown explicitly in FIG. 5B), although it will be understood that the present invention is not limited as such. The fourth layer 500 may be formed by high density plasma chemical vapor deposition CVD with $SiH_4/O_2$/argon ($O_2$) source.

In some embodiments the third layer 310 is removed before depositing the fourth layer 500. However, if the material of the fourth layer 500 has good gap filling capability and can be planarized together with the third layer 310 (described in the next step), than the third layer 310 need not be removed before depositing the fourth layer 500.

Figure 6A:
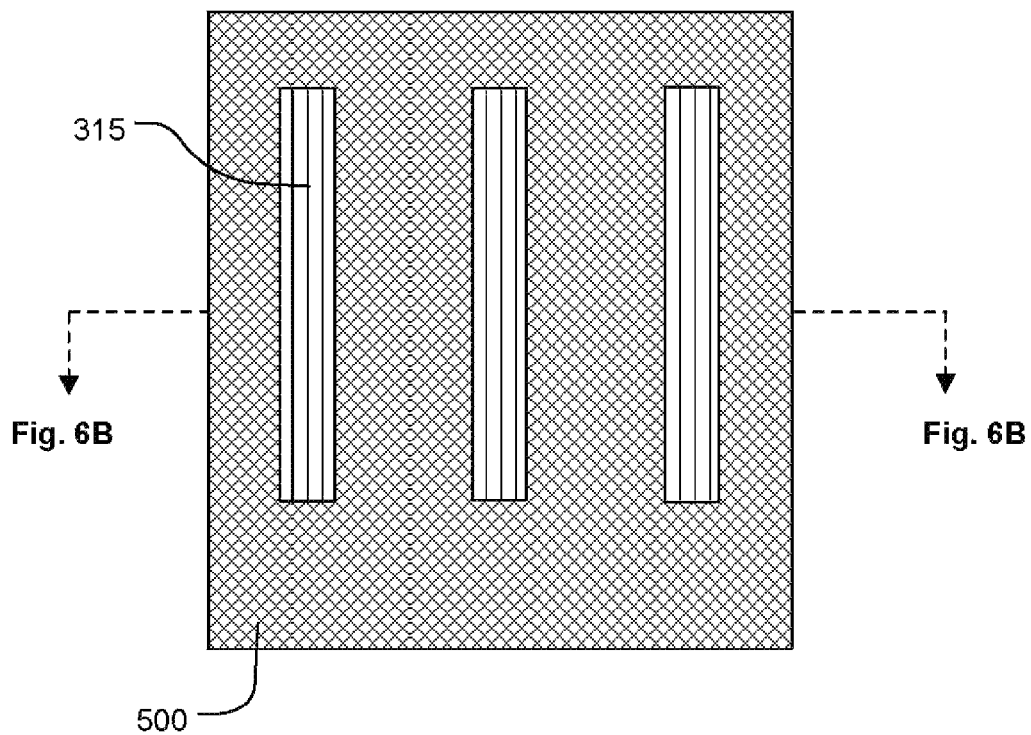
Figure 6B:
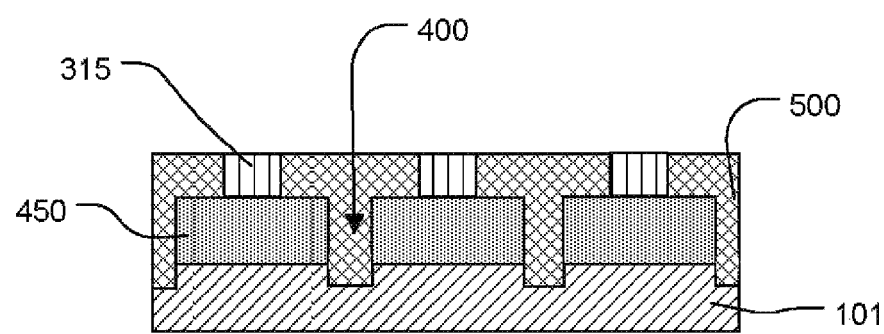

Next, the structure illustrated in FIGS. 5A and 5B is planarized to expose the second layer strips 315, resulting in the structure illustrated in top and cross-sectional views of FIGS. 6A and 6B respectively. The fourth layer 500 may be planarized, for example, using Chemical Mechanical Polishing CMP. Alternatively, for example, the fourth layer 500 may be planarized using a dry etch process.

Figure 7A:
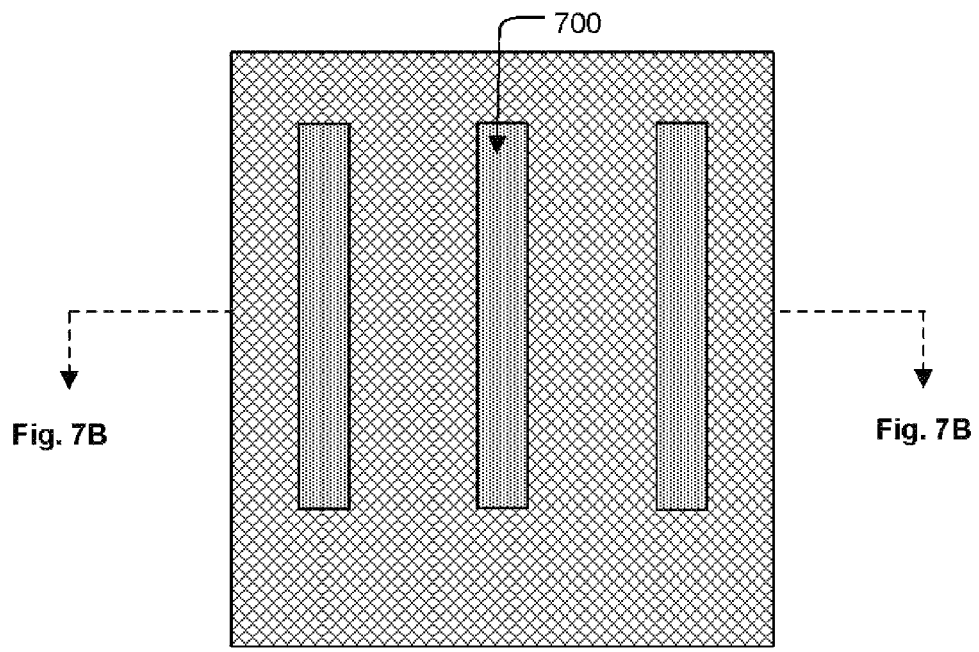
Figure 7B:
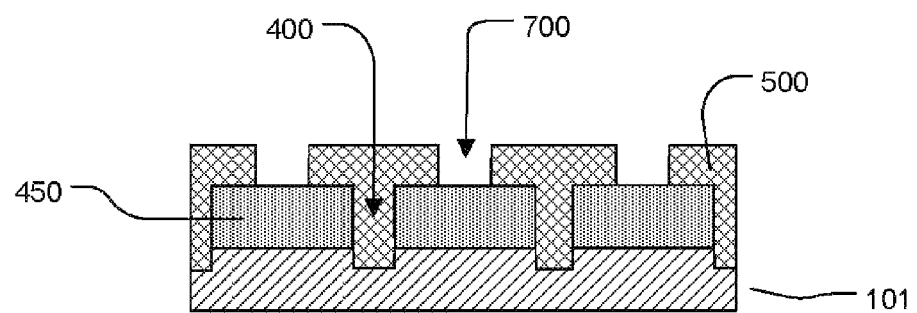

Next, etching is performed to remove the second layer strips 315 to form openings 700 and expose portions of the first layer strips 450, resulting in the structure illustrated in the top and cross-sectional views of FIGS. 7A and 7B respectively. The second layer strips 315 can be etched with a plasma process, e.g. chlorine (Cl2)/hydrogen bromide (HBr)/oxygen (O2), having a higher etching rate for the second layer strips 315 than the first layer strips 450 and fourth layer 500.

Next, the first layer strips 450 are etched using the fourth layer 500 as a mask to form second trenches 800 extending into the substrate 101 a distance 820 to define pairs of lines 850. The fourth layer 500 is then removed, resulting in the structure illustrated in the top and cross-sectional views of FIGS. 8A and 8B respectively.

The second trenches 800 have a second trench width 810 and extend into the substrate a distance 820. In an alternative embodiment, the trenches 800 extend to the top surface of the substrate 101.

Figure 8A:
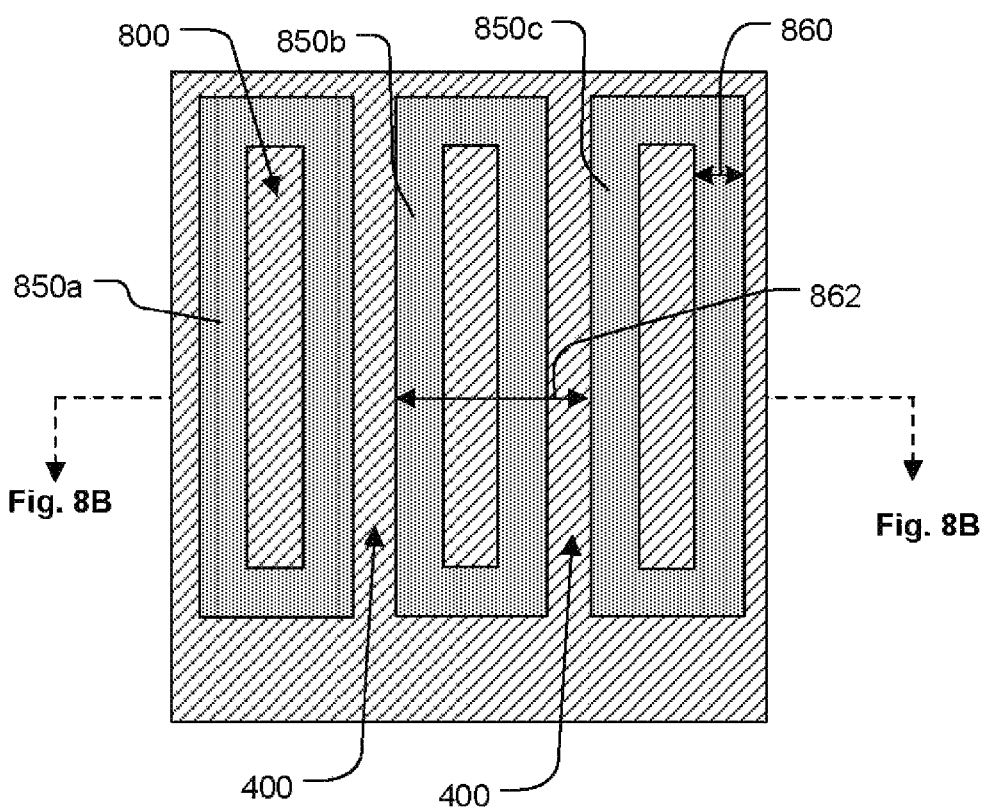
Figure 8B:
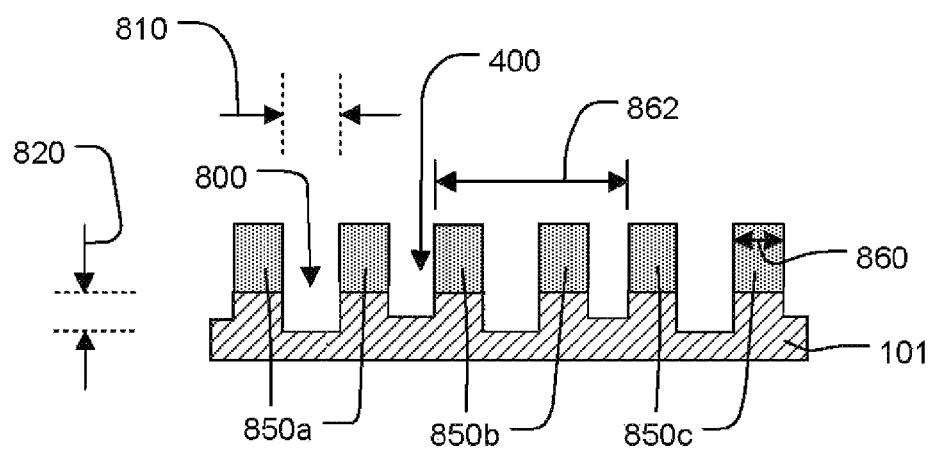

As can be seen in FIGS. 8A and 8B, adjacent pairs of lines 850 are separated by a first trench 400. It can also be seen that each pair of lines 850 comprise a first and a second line that are connected to each other at the ends of the first and second lines, so that each pair of lines 850 form an enclosed line having a circle-like top view and surrounding a second trench 800.

As can be understood, the trench widths 810 will be less than the separation width 210 of the originally patterned second layer strips 215, and thus the widths 810 of the second trenches 800 can be sublithographic. The width 810 of the second trenches 800 can be less than 60 nm, for example being between about 15 nm and 60 nm. Furthermore, the width 810 of the second trenches 800 can be different from the width 410 of the first trenches 400. Additionally, the distance 820 that the second trenches 800 extend into the substrate 101 can be different from the distance 425 that the first trenches 400 extend into the substrate 101.

Advantages of structures formed by the self-aligned process illustrated in FIGS. 1-8 include overcoming the difficulty of alignment control limitations of current lithographic equipment using double exposure methods.

Additionally, issues have arisen in traditional semiconductor lithography processes which make it difficult to manufacture lines having a lithographic pitch less than 130 nm. The present invention addresses these issues by manufacturing pairs of lines having a small pitch and sublithographic widths, resulting in the formation of high density devices. In embodiments the pairs of lines 850 can have a pitch 862 less than 260 nm, for example being less than 140 nm. More particularly, the pairs of lines 850 can have a pitch less than 70 nm.

Referring back to FIG. 3, it can be seen that the thickness 325 of the third layer strips 310 on the sidewalls of the second layer strips 315 is used as a mask to pattern the pairs of lines 850. Thus it can be appreciated that the pairs of lines 850 will have widths 860 that can be substantially the same and can be sublithographic. The widths 860 of the pairs of lines 850 can be less than 60 nm, for example being between 15 nm and 60 nm. Also, the variation in the widths 860 across an array of lines 850 can be very well controlled, for example being less than 20%. As can be seen in FIGS. 8A and 8B, the pitch of lines of the first layer is less than the pitch of the originally patterned second strips 215 illustrated in FIG. 2.

In the illustrated embodiment of FIGS. 1-8, the oxidation process used to form third layer strips 315 in FIG. 3 reduces the dimensions of the originally patterned second layer strips 215 in both the vertical and horizontal dimensions. FIGS. 9 and 10 illustrate a variation of the oxidation process of FIG. 3, resulting in the second layer strips 215 being reduced only in the horizontal dimension.

Figure 9A:
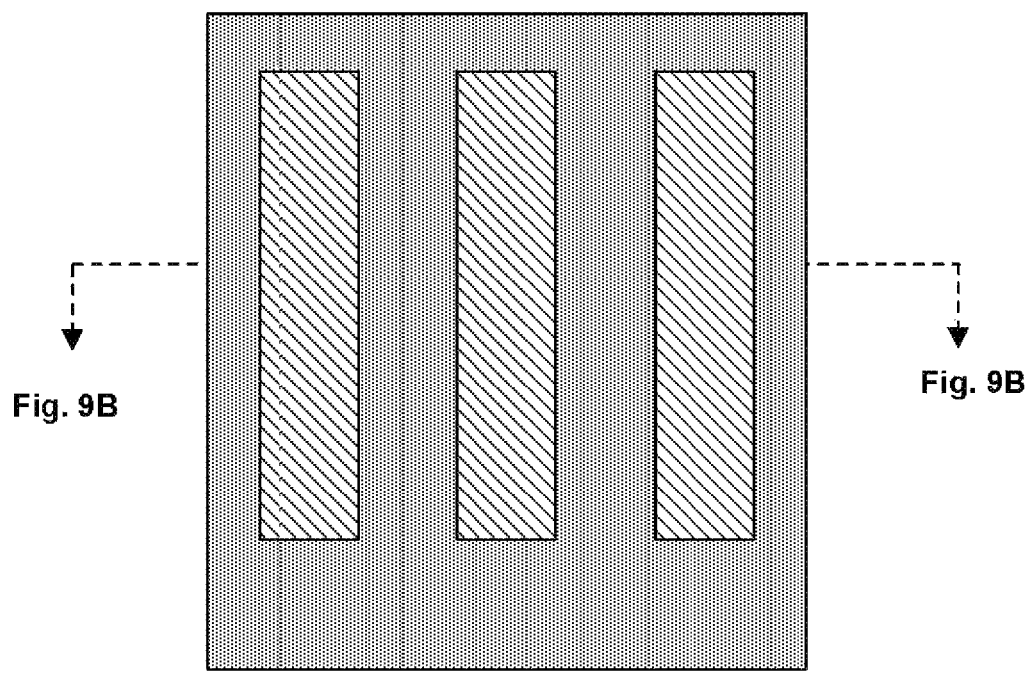
FIGS. 9 and 10 illustrate a variation of the oxidation process of FIG. 3.
Figure 9B:
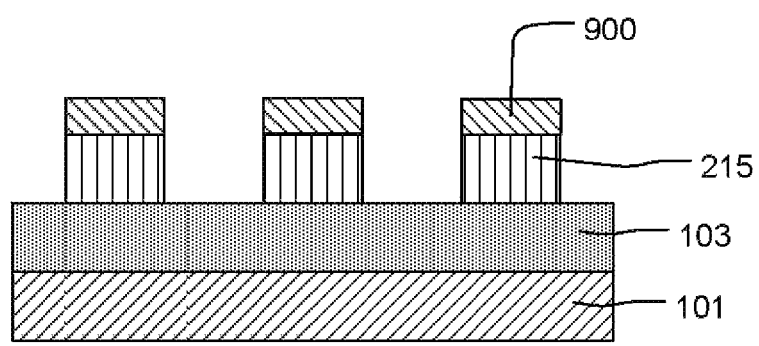

As shown in the respective top and cross-sectional views of FIGS. 9A and 9B, an additional mask layer 900 is patterned on the top surfaces of the second layer strips 215 prior to the oxidation step. The additional mask layer 900 may be formed on the second layer 105 prior to the formation of the patterned photoresist layer 107, in which case the mask layer 900 may be patterned at the same time as the second layer 105 is patterned to form strips 215. The mask layer 900 comprises material that is not affected by the oxidation process, thus preventing oxidation of the second layer features 200 in the vertical dimension during the oxidation process.

Figure 10A:
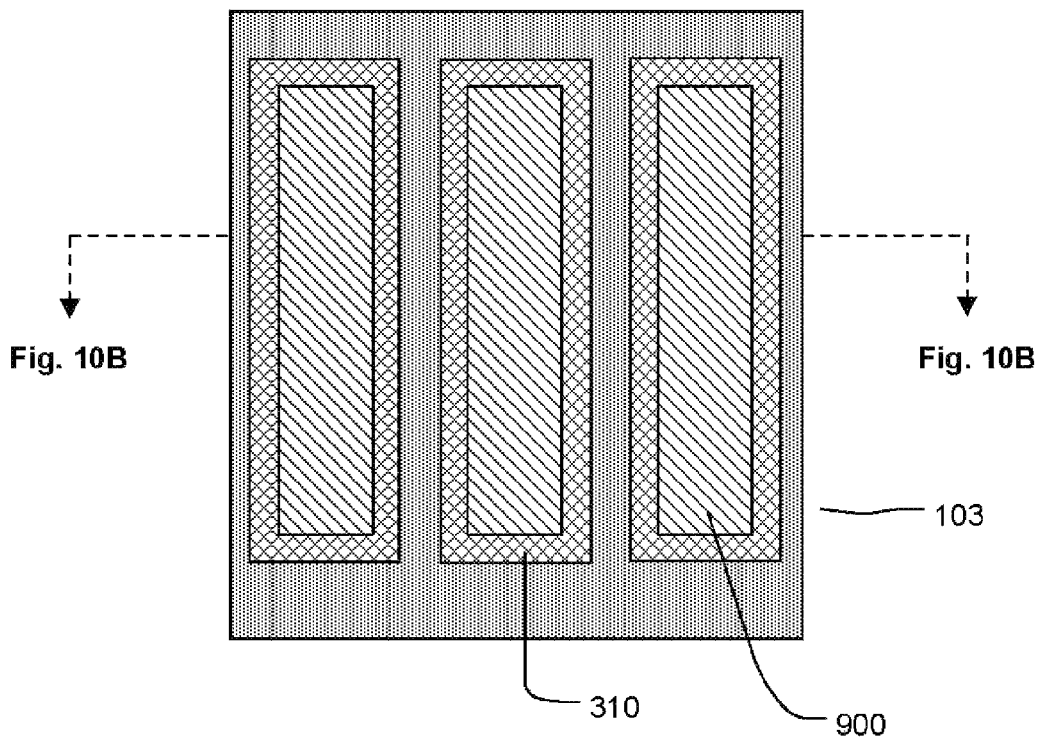
Figure 10B:
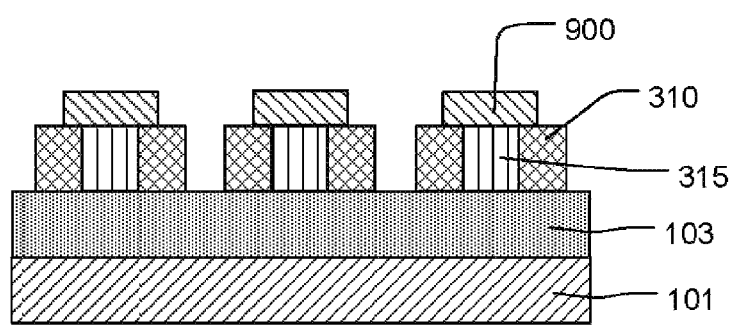

Accordingly, when oxidation is performed on the structure illustrated in FIGS. 9A and 9B, the third material strips 310 are formed only on the sidewalls of the remaining portions of the second layer strips 315, resulting in the structure illustrated in top and cross-sectional views of FIGS. 10A and 10B respectively. The mask layer 900 is then removed in some step prior to the etching of the first layer 103 (discussed above with reference to FIGS. 7 and 8).

Figure 11A:
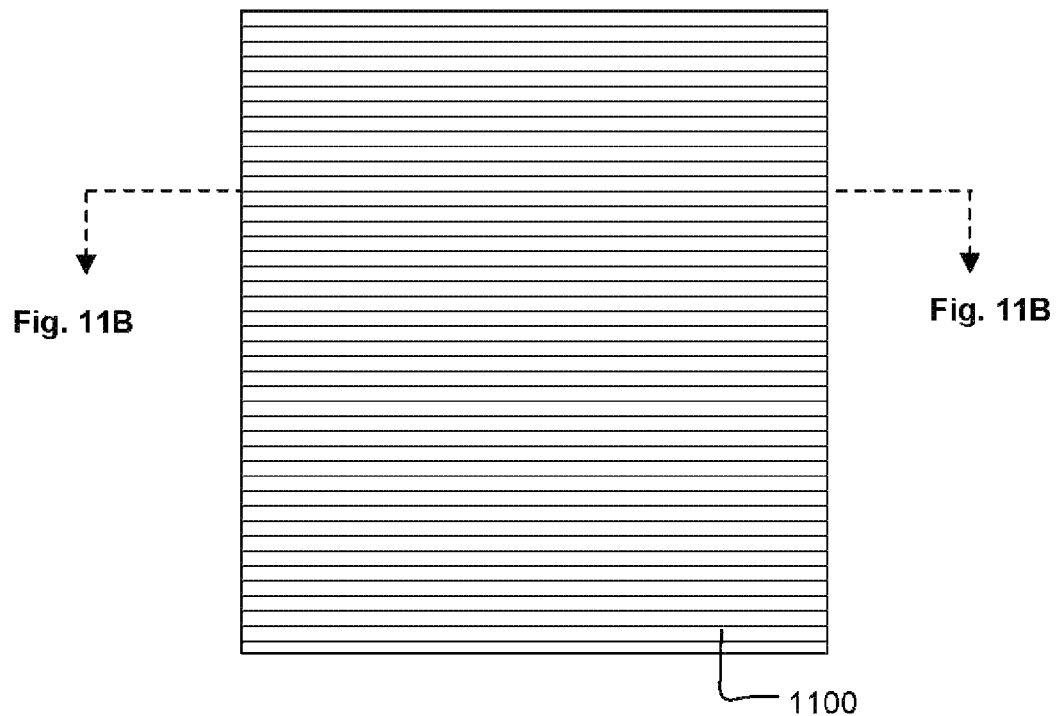
FIGS. 11-13 illustrate an alternative conversion process to that illustrated in FIG. 3.
Figure 11B:
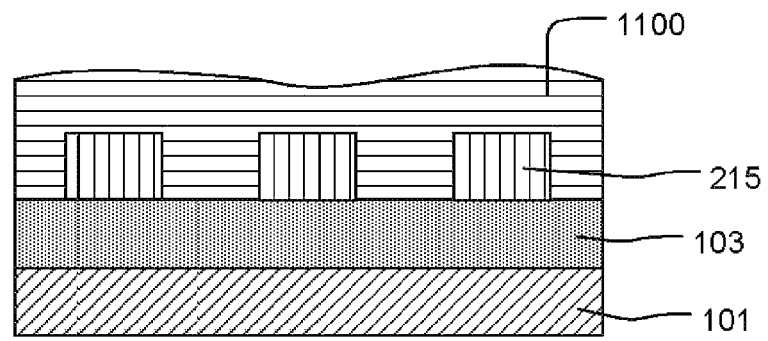
Figure 12A:
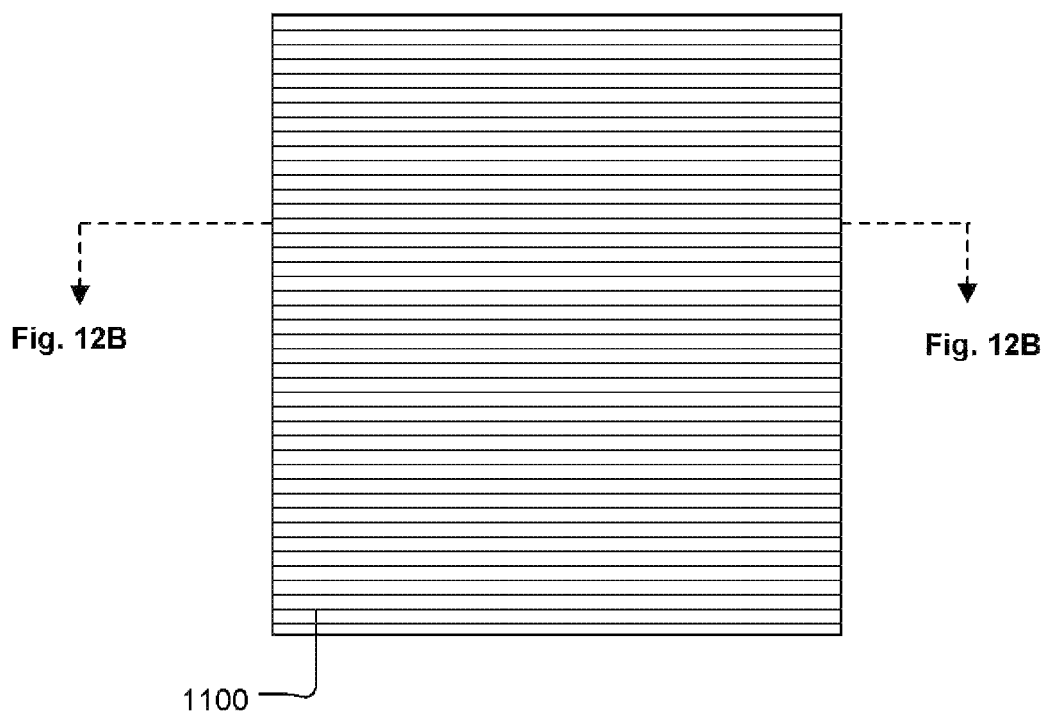
Figure 12B:
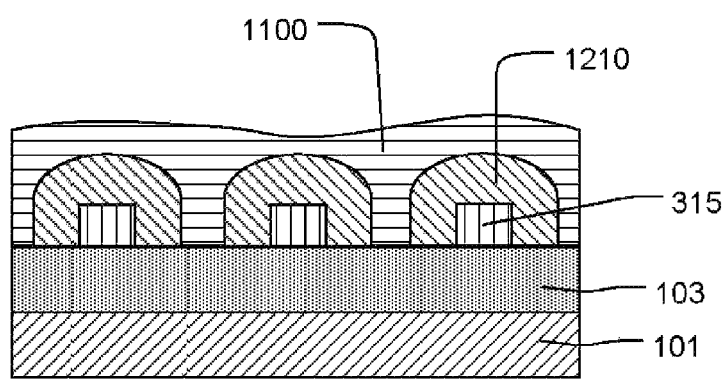

FIGS. 11-13 illustrate an alternative conversion process to that described above with reference to FIGS. 3A and 3B.

A metal layer 1100 is formed on the structure illustrated in FIGS. 2A and 2B, resulting in the structure illustrated in top and cross-sectional views of FIGS. 11A and 11B respectively. The metal layer 1100 may comprise a refractory metal formed by sputtering under high vacuum conditions. Examples of refractory metals that may be used include Platinum, Nickel, Cobalt, Titanium, Tantalum, or Molybedenum.

Next, a sintering process is performed on the structure illustrated in FIGS. 11A and 11B to consume a portion of the second layer strips 215 to form third layer strips 1210 on the remaining second layer strips 315. Preferably the first layer 103 comprises material that does not react to the sintering process.

The sintering process has the effect of shrinking the originally patterned strips 215 in the vertical and horizontal dimensions, thus the widths of the remaining portions of the second layer strips 315 are smaller than those of the originally patterned second layer strips 215. Furthermore, due to the sintering process and the differences in densities of the second layer material and the third layer material, the third layer strips 1210 will have widths greater than that of the original patterned second layer strips 215. Accordingly, the spaces between the third layer strips 1210 will be less than the spaces between the originally patterned second layer strips 215, and can be sublithographic.

In the illustrated embodiment the sintering process comprises a silicide process used to form the third layer 1210 such as a rapid thermal process RTP in the temperature range from 400° C. to 800° C., the third layer 1210 comprising a silicon-metal compound of the metal of layer 1100.

Figure 13A:
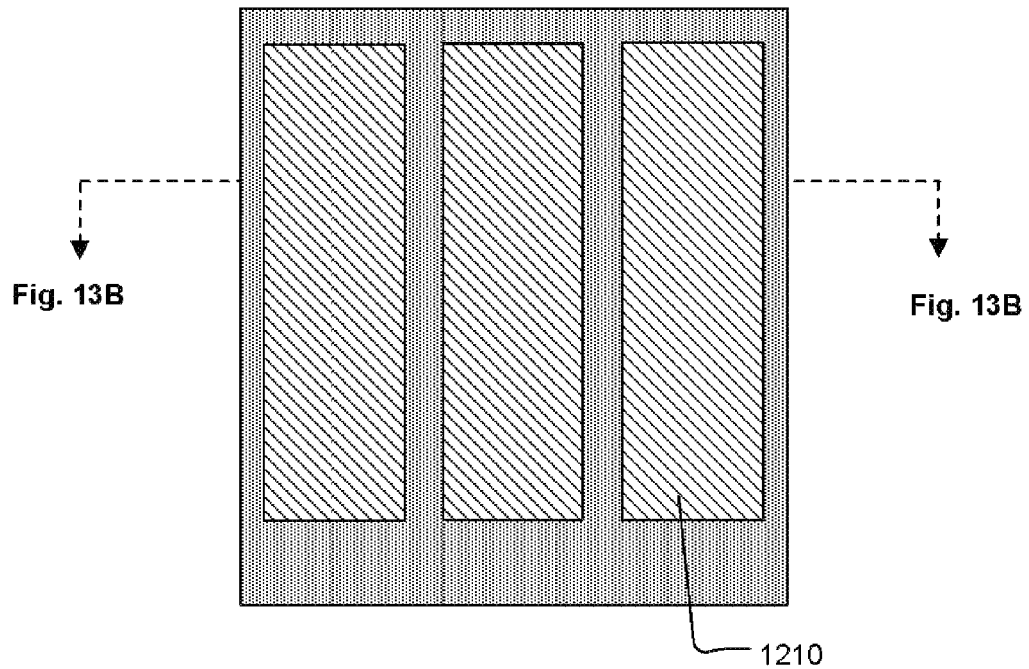
Figure 13B:
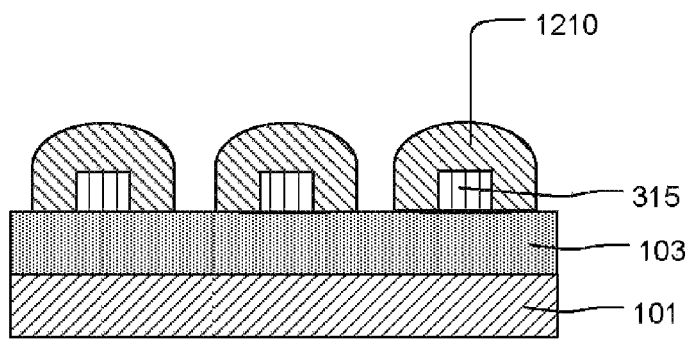

After the sintering process, the residual metal of layer 1100 is removed using, for example, a wet strip process, resulting in the structure illustrated in the top and cross-sectional views of FIGS. 13A and 13B respectively. As will be understood by those skilled in the art, the structure illustrated in FIGS. 13A and 13B can be used to form pairs of lines defined by first and second trenches in a similar manner to the steps described above with respect to FIGS. 4-8.

In the above embodiments, the third layer material is formed at the sidewalls of the second layer material by means which convert a portion of the second layer material into the third layer material. These processes may be thermal processes, as in the above-described embodiments, or can be another form of chemical reaction or interdiffusion reaction in other embodiments. Any process that converts a portion of the second layer material into the third layer material will suffice, so long at the impact of the process on other materials in the structure is insignificant or otherwise accommodated.

In addition, it will be appreciated that the process of forming the third layer material has the effect of reducing the width of the second layer features, and replacing the volume of second volume material with a larger volume of third layer material. Thus, the resulting third layer structures have widths greater than the starting width of the second layer features.

FIGS. 14-20 illustrate a second manufacturing process for a pitch reduction method.

Figure 14A:
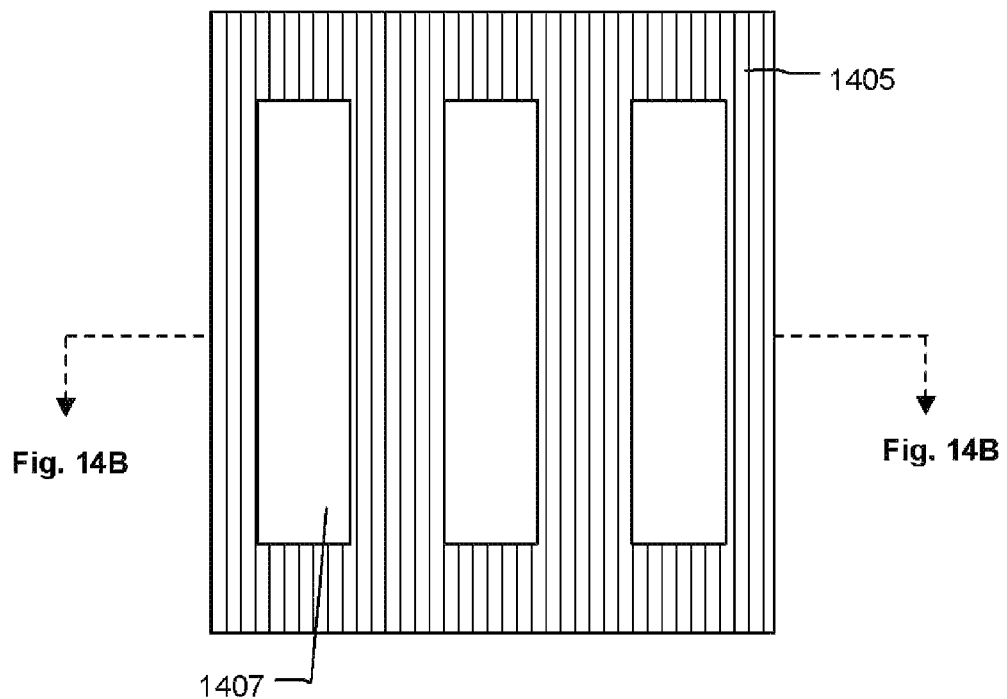
FIGS. 14-20 illustrate a second manufacturing process for a pitch reduction method.
Figure 14B:
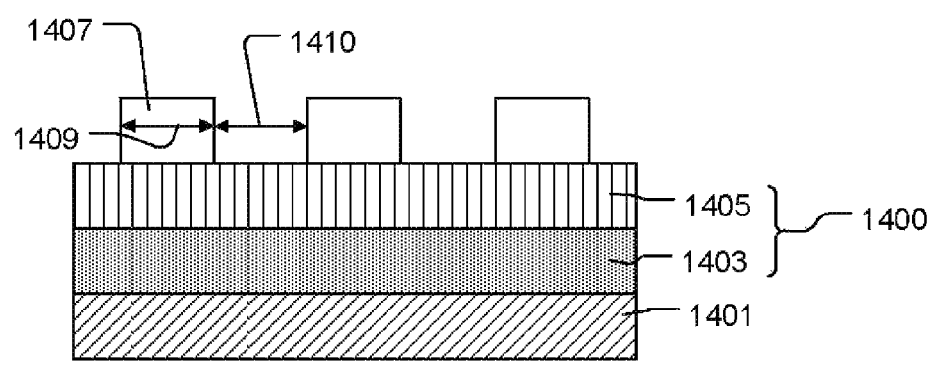

FIGS. 14A and 14B illustrate top and cross-sectional views respectively of photoresist strips 1407 patterned on a multi-layer structure 1400 overlying a substrate 1401. In the illustrated embodiment the multi-layer structure 1400 comprises a first layer over the substrate layer 1403 and a second layer 1405 over the first layer 1403. The layers of the multi-layer structure 1400 and the substrate 1401 may each include one or more layers depending upon the ultimately desired circuitry. For example, the substrate layer 1401 may comprise a first polysilicon layer on a first dielectric layer, the first dielectric layer on a semiconductor substrate having source and drain regions implanted therein.

The photoresist strips 1407 have a width 1409 and a separation distance or width 1410, both the width 1409 and the separation distance 1410 preferably being equal to a minimum feature size for a lithographic process used to form the photoresist strips 1407.

The first and second layers 1403, 1405 preferably comprise materials that can be selectively processed (e.g. selectively etched) relative to one another. The first layer 1403 may be a dielectric, and in the illustrated embodiment comprises silicon nitride. The second layer 1405 comprises polysilicon in the illustrated embodiment.

Figure 15A:
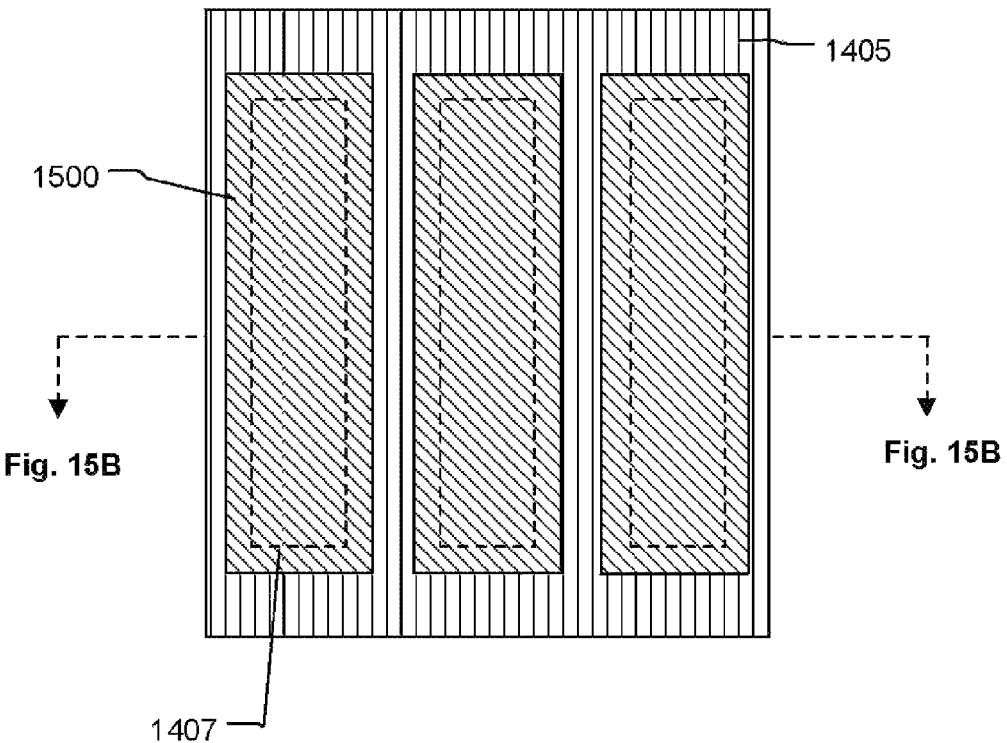
Figure 15B:
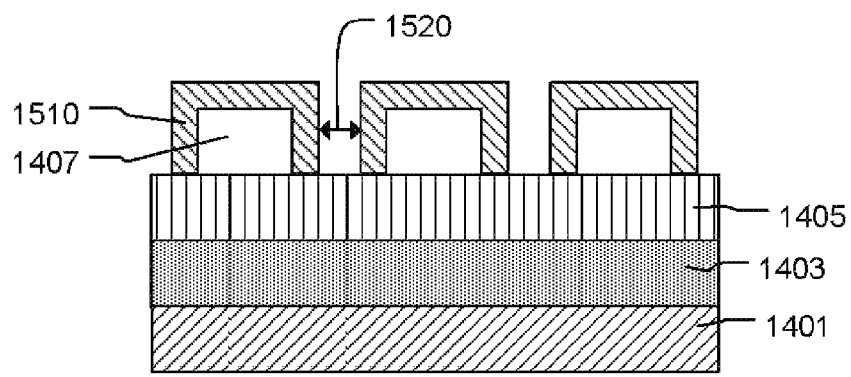

Next, third layer strips 1510 are formed on the top and sidewalls surfaces of the photoresist strips 1407, resulting in the structure illustrated in top and cross-sectional views of FIGS. 15A and 15B respectively. In the illustrated embodiment the third layer strips 1510 comprise polymer material.

The third layer strips 1510 will have widths greater than that of the photoresist strips 1407. Accordingly, the spaces 1520 between the third layer strips 1510 will be less that the separation distance 1410 between the photoresist strips 1407.

Next, the first and second layers 1403, 1405 are etched using the third layer strips 1510 as a mask to form first trenches 1600 extending into the substrate 1401 a distance 1625 to define second layer strips 1660 of second layer material and first layer strips 1650 of first layer material. The third layer 1510 and the photoresist strips 1407 are then removed, resulting in the top and cross-sectional views illustrated in FIGS. 15A and 15B respectively. The first and second layers 1403, 1405 can be etched by a single etch chemistry, or the etching can be a two step process where the second layer 1405 is etched with a first etch chemistry and the first layer 1403 is etched with a second etch chemistry.

The trenches 1600 have a trench width 1610 that will be less than the minimum feature size of the lithographic process used to form the photoresist strips 1407. The width 1610 of the trenches 1600 can be less than 60 nm, for example being between 15 nm and 60 nm. In the illustrated embodiment the trenches 1600 extend into the substrate 1401 a distance 1625. Alternatively, the trenches 1600 extend to the top surface of the substrate 1401.

Figure 16A:
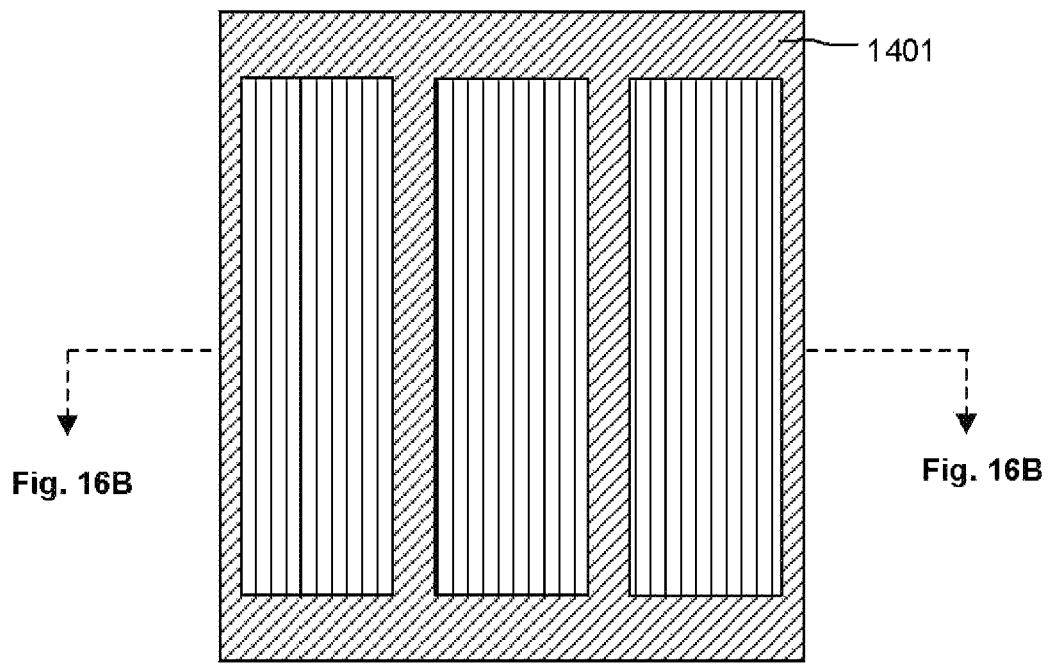
Figure 16B:
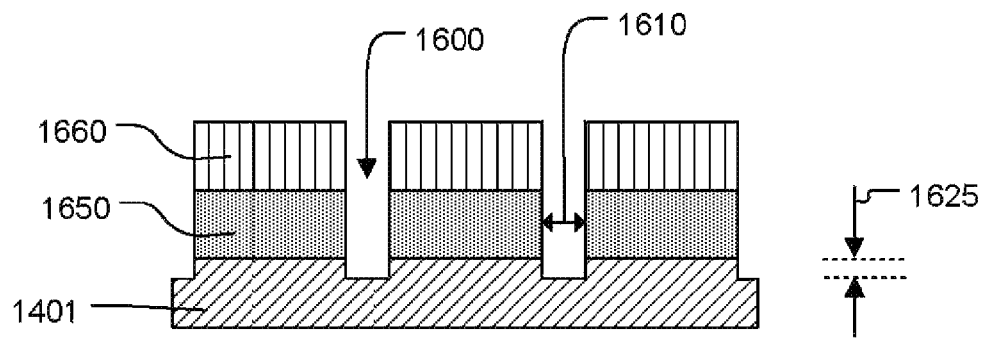
Figure 17A:
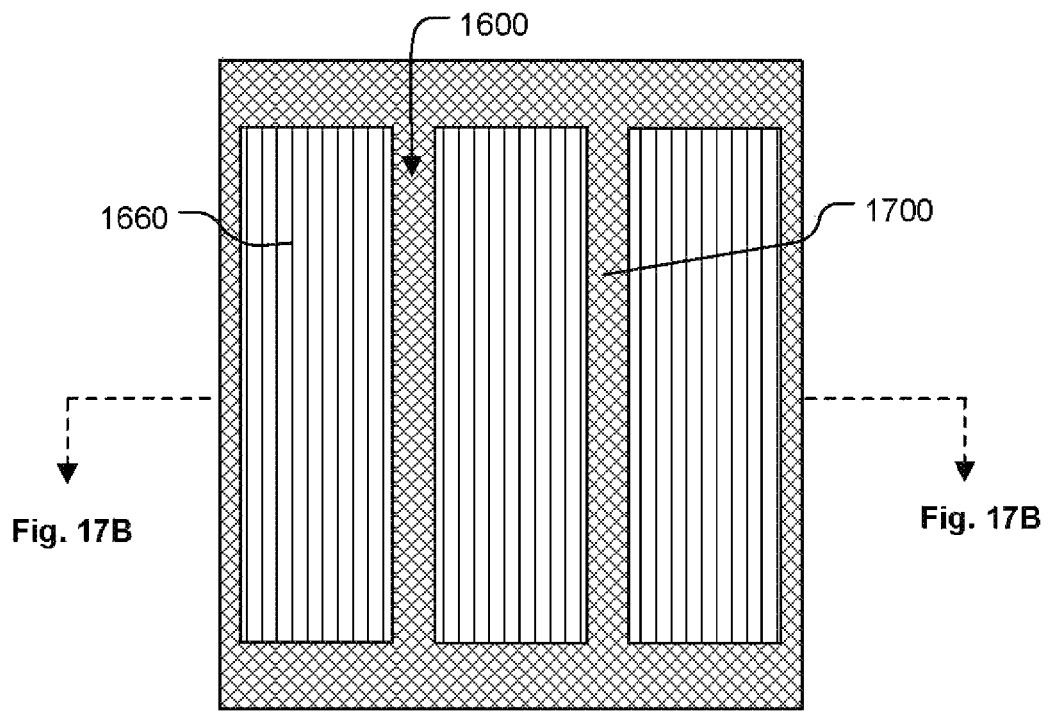
Figure 17B:
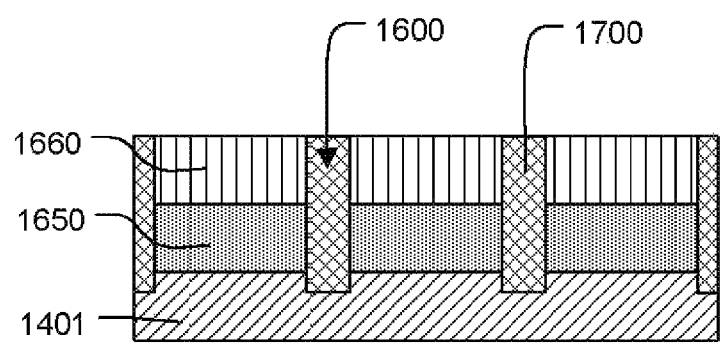

Next, a fourth layer 1700 is formed on the structure illustrated in FIGS. 16A and 16B to fill the trenches 1600, and the fourth layer 1700 is planarized to expose the second layer strips 1660, resulting in the structure illustrated in top and cross-sectional views of FIGS. 17A and 17B respectively. In the illustrated embodiment the fourth layer 1700 comprises one or more dielectric layers.

Figure 18A:
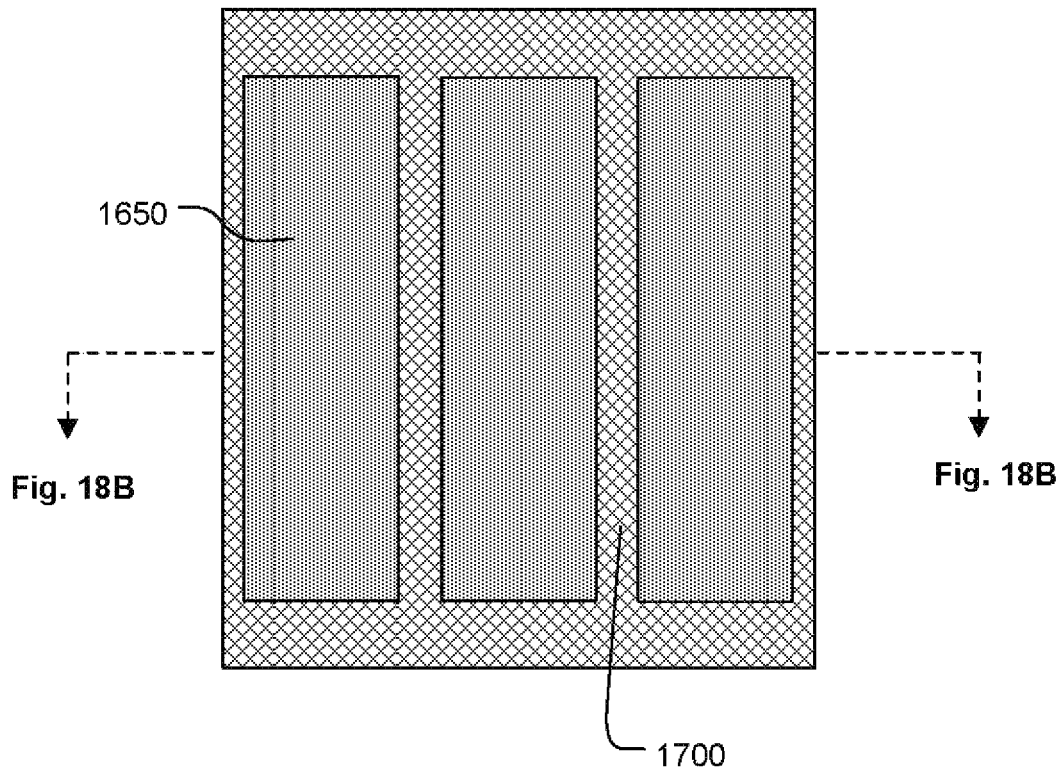
Figure 18B:
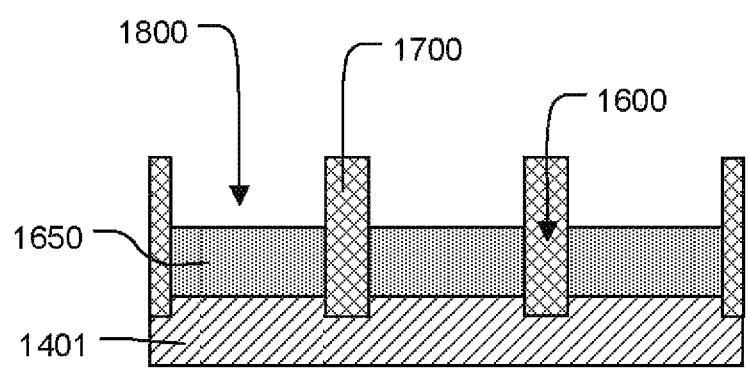

Next, etching is performed to remove the second layer strips 1660 to expose the first layer strips 1650, resulting in the structure illustrated in top and cross-sectional views of FIGS. 18A and 18B respectively. In the illustrated embodiment the second layer strips 1660 comprise polysilicon and are removed by a wet etch process that uses $HNO_3$ and HF.

Figure 19A:
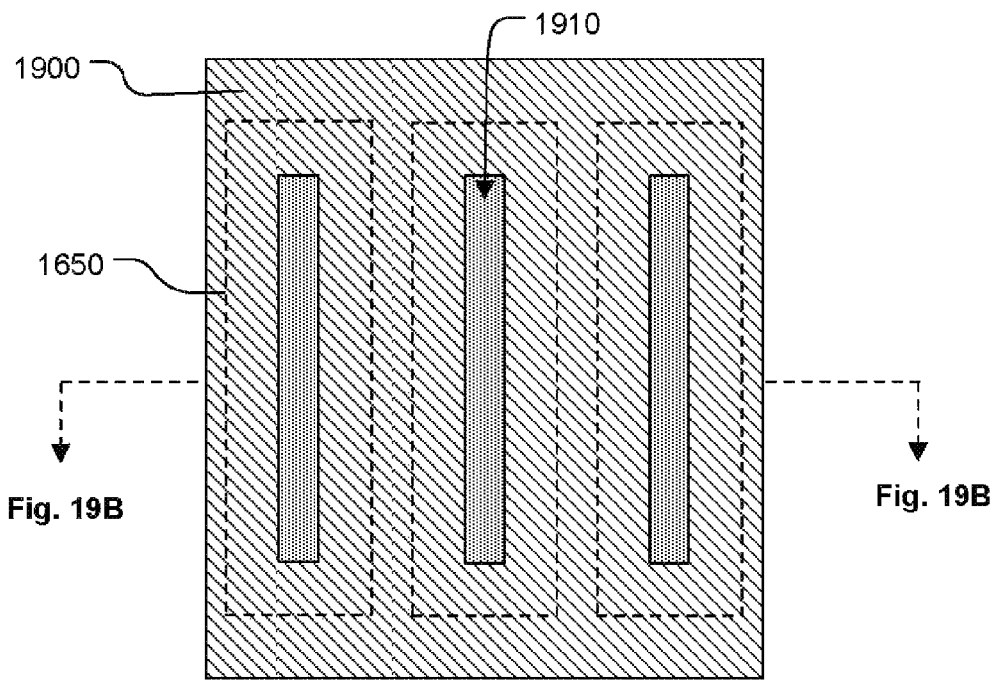
Figure 19B:
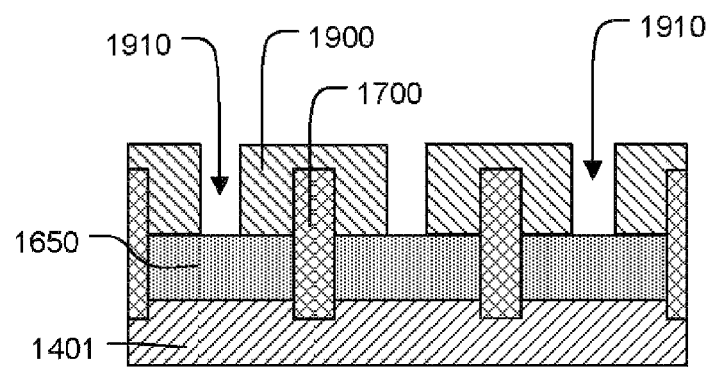

Next, a fifth layer 1900 is formed on the top and exposed sidewall surfaces of the fourth layer 1700 to define openings 1910 exposing a portion of the first layer strips 1650, resulting in the structure illustrated in top and cross-sectional views of FIGS. 19A and 19B respectively. In the illustrated embodiment the fifth layer 1900 comprises a polymer material.

Next, the first layer strips 1650 are etched using the fifth layer 1900 as a mask to form second trenches 2000 extending into the substrate 1401 a distance 2020 to define pairs of lines 2050. The fourth layer 1700 and the fifth layer 1900 are then removed, resulting in the structure illustrated in top and cross-sectional views of FIGS. 20A and 20B.

The second trenches 2000 have a second trench width 2010 and extend into the substrate a distance 2020. In an alternative embodiment, the trenches 2000 extend to the top surface of the substrate 1401. The width 2010 of the trenches 2000 can be less than 60 nm, for example being between 15 nm and 60 nm.

Figure 20A:
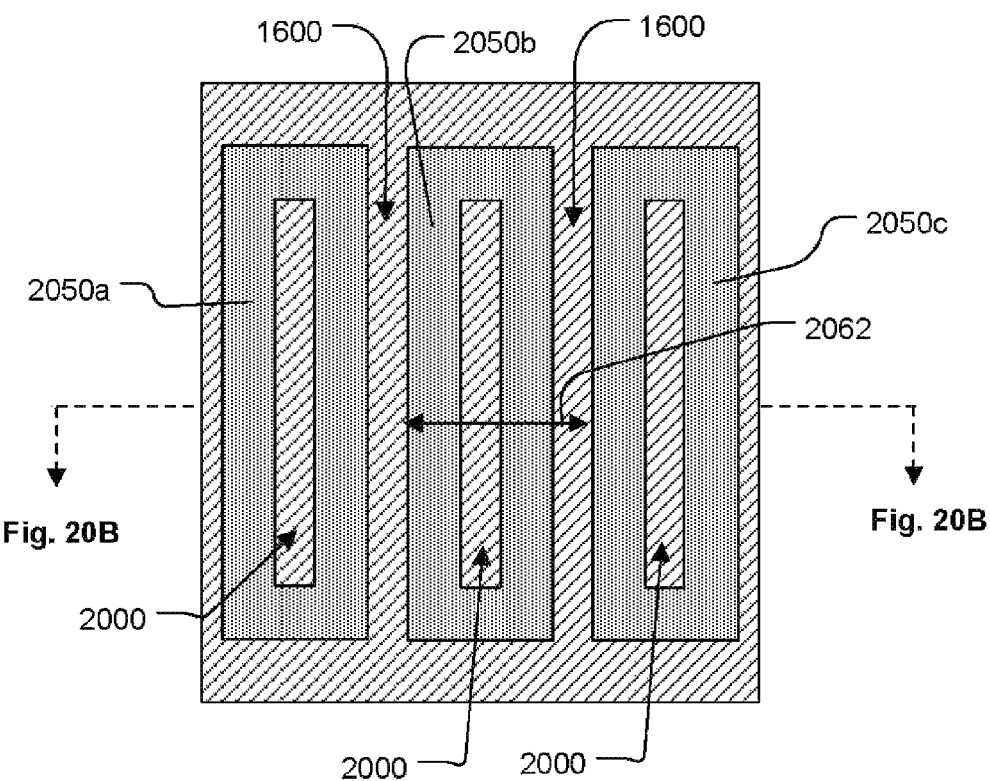
Figure 20B:
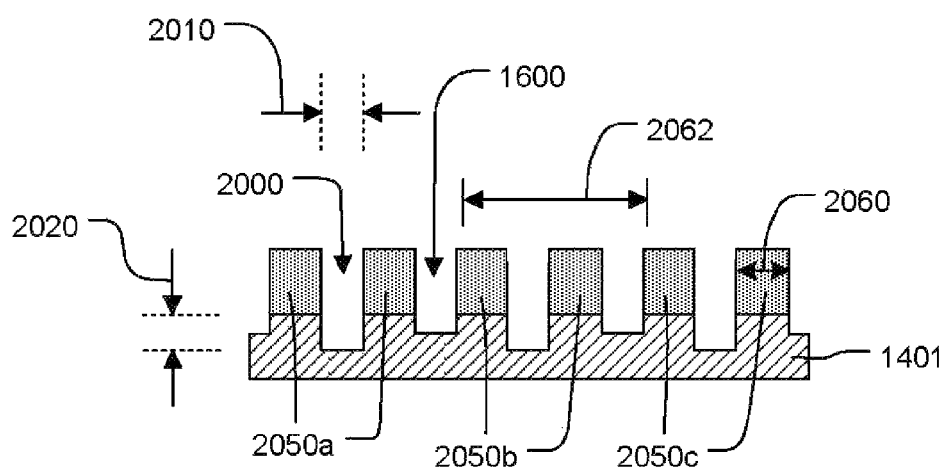

As can be seen in FIGS. 20A and 20B, adjacent pairs of lines 2050 are separated by a first trench 1600. It can also be seen that each pair of lines 2050 comprise a first and a second line that are connected to each other at the ends of the first and second lines, thus each pair of lines 2050 surrounds a second trench 2000.

As can be understood, the trench widths 2010 will be less will be less than the separation width 1410 of the patterned photoresist 1407, and thus the widths 2010 of the trenches 2000 can be sublithographic. Furthermore, the width 2010 of the second trenches 2000 can be different from the width 1610 of the first trenches 1600. Additionally, the distance 2020 that the second trenches 2000 extend into the substrate can be different from the distance 1625 that the first trenches 1600 extend into the substrate 1401.

Issues have arisen in traditional semiconductor lithography processes which make it difficult to manufacture lines having a lithographic pitch less than 130 nm. The present invention addresses these issues by manufacturing pairs of lines having a small pitch and sublithographic widths, resulting in the formation of high density devices. In embodiments the pairs of lines 2050 can have a pitch 2062 less than 260 nm, for example being less than 140 nm. More particularly, the pairs of lines 2050 can have a pitch less than 70 nm.

Referring back to FIG. 19, it can be seen that the thickness of the fifth layer 1900 on the sidewalls of the fourth layer 1700 is used as a mask to pattern pairs of lines 2050. Thus, it can be appreciated that the pairs of lines 2050 will have widths 2060 that can be substantially the same. In the structure illustrated in FIGS. 20A and 20B, the pitch of lines of the first layer is less than the pitch of the photoresist strips 1407 of FIG. 14.

Note that in the above embodiments, the feature narrowing process described herein can be repeated if desired, assuming appropriate materials are used in the multi-layer structure. The repeated feature narrowing process can be thought of as being constructed by adding a second instance of the process steps described above either before or after the first instance described above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. An integrated circuit comprising:
a substrate; and
a plurality of pairs of lines overlying the substrate to define a plurality of first trenches and a plurality of second trenches, the plurality of first trenches extending into the substrate a distance different than that of the plurality of second trenches, wherein adjacent pairs of lines are separated by a first trench in the plurality of first trenches, and each pair of lines comprises a first line and second line defining a corresponding second trench in the plurality of second trenches.

2. The integrated circuit of claim 1, wherein the plurality of first trenches have a width different than that of the plurality of second trenches.

3. The integrated circuit of claim 1, wherein the first and second lines of each pair of lines form an enclosed line surrounding the corresponding second trench.

4. The integrated circuit of claim 1, wherein the first and second lines of each pair of lines have a sublithographic width.

5. The integrated circuit of claim 1, wherein the first and second lines of each of the plurality of pairs of lines have substantially the same width.

6. The integrated circuit of claim 1, wherein the first and second lines of each of the plurality of pairs of lines have a width that varies across the plurality of pairs of lines by less than 20%.

7. The integrated circuit of claim 1, wherein each of the first and second lines in the plurality of pairs of lines have a width less than 60 nm.

8. The integrated circuit of claim 1, wherein each of the plurality of first and second trenches have a width less than 60 nm.

9. The integrated circuit of claim 1, wherein
the first and second lines in the pairs of lines include connecting elements at ends of the lines so that each pair of lines in the plurality of pairs surrounds the corresponding second trench in the plurality of second trenches.

10. The integrated circuit of claim 9, wherein the first and second lines of each of the plurality of pairs of lines have a sublithographic width.

11. The integrated circuit of claim 9, wherein the first and second lines of each of the plurality of pairs of lines have substantially the same width.

12. The integrated circuit of claim 9, wherein the first and second lines of each of the plurality of pairs of lines have a width that varies across the plurality of pairs of lines by less than 20%.

13. The integrated circuit of claim 9, wherein the first and second lines of each of the plurality of pairs of lines have a width less than 60 nm.

14. The integrated circuit of claim 9, wherein each of the plurality of first and second trenches have a width less than 60 nm.

15. The integrated circuit of claim 1, wherein
the plurality of pairs of lines have a pitch less than 260 nm and have a sublithographic width.

16. The integrated circuit of claim 15, wherein the plurality of pairs of lines have a pitch less than 140 nm.

17. The integrated circuit of claim 15, wherein the plurality of pairs of lines have a pitch less than 70 nm.

18. The integrated circuit of claim 15, wherein the first and second lines of each pair of lines include connecting elements at ends of the lines so that each pair of lines in the plurality of pairs surround the corresponding second trench.

19. The integrated circuit of claim 15, wherein the first and second lines of each of the plurality of pairs of lines have substantially the same width.

20. The integrated circuit of claim 1, wherein the first and second lines of each of the plurality of pairs of lines have a width that varies across the plurality of pairs of lines by less than 20%.

\* \* \* \* \*